(12) United States Patent
Pons et al.

(10) Patent No.: US 11,095,277 B2
(45) Date of Patent: Aug. 17, 2021

(54) CABLE VOLTAGE DROP COMPENSATION

(71) Applicant: STMicroelectronics (Grenoble 2) SAS, Grenoble (FR)

(72) Inventors: Alexandre Pons, Vizille (FR); Jean Camiolo, St. Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 16/913,755

(22) Filed: Jun. 26, 2020

(65) Prior Publication Data

US 2020/0412348 A1 Dec. 31, 2020

(30) Foreign Application Priority Data

Jun. 28, 2019 (FR) ...................................... 1907197

(51) Int. Cl.
*H03K 5/01* (2006.01)
*H03F 3/45* (2006.01)

(52) U.S. Cl.
CPC .......... *H03K 5/01* (2013.01); *H03F 3/45475* (2013.01)

(58) Field of Classification Search
None
See application file for complete search history.

(56) References Cited

U.S. PATENT DOCUMENTS

| 2008/0061217 | A1* | 3/2008 | Burkatovsky | H03F 3/08 250/214 A |
| 2010/0321067 | A1* | 12/2010 | Hurwitz | H03G 3/001 327/103 |
| 2018/0020288 | A1* | 1/2018 | Risbo | H03F 3/3022 |
| 2018/0074574 | A1 | 3/2018 | Camiolo et al. | |
| 2018/0248353 | A1* | 8/2018 | Creech | H02H 9/025 |
| 2019/0074763 | A1 | 3/2019 | Pons | |
| 2019/0179361 | A1* | 6/2019 | Hanson | H03L 7/181 |
| 2020/0112252 | A1* | 4/2020 | Chesneau | H03F 1/0205 |
| 2020/0264217 | A1* | 8/2020 | Costa | H03F 3/45183 |

FOREIGN PATENT DOCUMENTS

| EP | 3297118 A1 | 3/2018 |
| FR | 3070774 A1 | 3/2019 |

* cited by examiner

*Primary Examiner* — Lincoln D Donovan
*Assistant Examiner* — Khareem E Almo
(74) *Attorney, Agent, or Firm* — Slater Matsil, LLP

(57) ABSTRACT

A voltage source device includes a voltage converter configured to generate a supply voltage at an output node of the voltage converter. A current source is configured to apply a current to a first output terminal of the voltage source device in order to detect a cable voltage drop. A compensation circuit is configured to generate a feedback signal based on a voltage at the first output terminal. The supply voltage is generated based on the feedback signal.

21 Claims, 3 Drawing Sheets

CABLE VOLTAGE DROP COMPENSATION

CROSS-REFERENCE TO RELATED APPLICATIONS

This application claims priority to French Patent Application No. 1907197, filed on Jun. 28, 2019, which application is hereby incorporated herein by reference.

TECHNICAL FIELD

The present disclosure relates generally to the field of voltage devices and, in particular embodiments, to cable voltage drop compensation.

BACKGROUND

Under the USB (Universal Serial Bus) type C (USB-C) protocol, a device having a USB-C socket may act as a voltage source for another device coupled via the USB-C interface and operating as a sink. According to the USB-C protocol, the voltage level supplied by the source is variable in the range 5 to 20 V.

Prior to the voltage being supplied by the source device, the source and sink devices for example negotiate the voltage level to be supplied. The source device should then maintain the agreed supply voltage level while the cable is connected and the sink is drawing a current. Indeed, if this voltage drops below a certain offset with respect to the agreed level, the sink device risks detecting an under-voltage, leading it to consider that the cable has been unplugged, and resetting the connection, thereby interrupting the voltage supply to the sink device.

A difficulty is that there is generally a non-negligible resistance between the voltage source within the source device, and the load in the sink device. This resistance can lead to a significant voltage drop between the voltage source on the source side, and the load on the sink side.

There is a technical difficulty in compensating for this voltage drop and ensuring that an under-voltage will not be present at the sink.

SUMMARY

Embodiments relate to a circuit and method for the compensation of a voltage drop over a cable between a voltage source device and a sink device.

Embodiments described herein can at least partially address one or more difficulties in the prior art.

According to one aspect, a voltage source device comprises a voltage converter for generating a supply voltage at an output node of the voltage converter based on a feedback signal provided on a feedback line. A current source is configured to apply a current to a first output terminal of the voltage source device in order to detect a cable voltage drop. A compensation circuit is configured to generate the feedback signal based on a voltage at the first output terminal.

According to one embodiment, the compensation circuit comprises an analog compensation circuit configured to generate an analog compensation signal and a feedback control circuit configured to adjust the feedback signal provided on the feedback line based on the compensation signal.

According to one embodiment, the analog compensation circuit comprises a differential amplifier configured to amplify a difference between the voltage at the first output terminal and a reference voltage.

According to one embodiment, the voltage source device further comprises a dummy circuit configured to generate the reference voltage. The dummy circuit comprises a further current source coupled in series with a resistor, the reference voltage being the voltage across the resistor. The differential amplifier is configured to control a first transistor to conduct an offset current that is passed through the resistor.

According to one embodiment, the differential amplifier is also configured to control a second transistor, the compensation signal being based on a current conducted by the second transistor.

According to one embodiment, the compensation circuit further comprises a voltage divider comprising the series connection of first, second and third resistors coupling the output node of the voltage converter, or a second output terminal of the voltage source device, to a first supply rail. The compensation signal is a current drawn from a first intermediate node between the first and second resistors and the feedback signal being provided by a second intermediate node between the second and third resistors.

According to a further aspect, a power supply arrangement comprises the above voltage source device, a sink device, and a cable coupling. The first output terminal of the voltage source device is coupled to a first terminal of the sink device, the second output terminal of the voltage source device is coupled to a second terminal of the sink device, and a ground terminal of the voltage source device is coupled to a ground terminal of the sink device.

According to one embodiment, the sink device comprises a resistor coupled between the first terminal and ground terminal of the sink device.

According to one embodiment, the sink device further comprises a load coupled between the second terminal and the ground terminal of the sink device.

According to a further aspect, a method can be used for compensating for a voltage drop over a cable coupling a voltage source device to a sink device. The method comprises generating a supply voltage at an output node of a voltage converter based on a feedback signal provided on a feedback line, applying, by a current source, a current to a first output terminal of the voltage source device in order to detect a cable voltage drop, and generating, by a compensation circuit, the feedback signal based on a voltage at the first output terminal.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

Unless specified otherwise, the expressions "around", "approximately", "substantially" and "in the order of" signify within 10%, and preferably within 5%.

Figure 1:
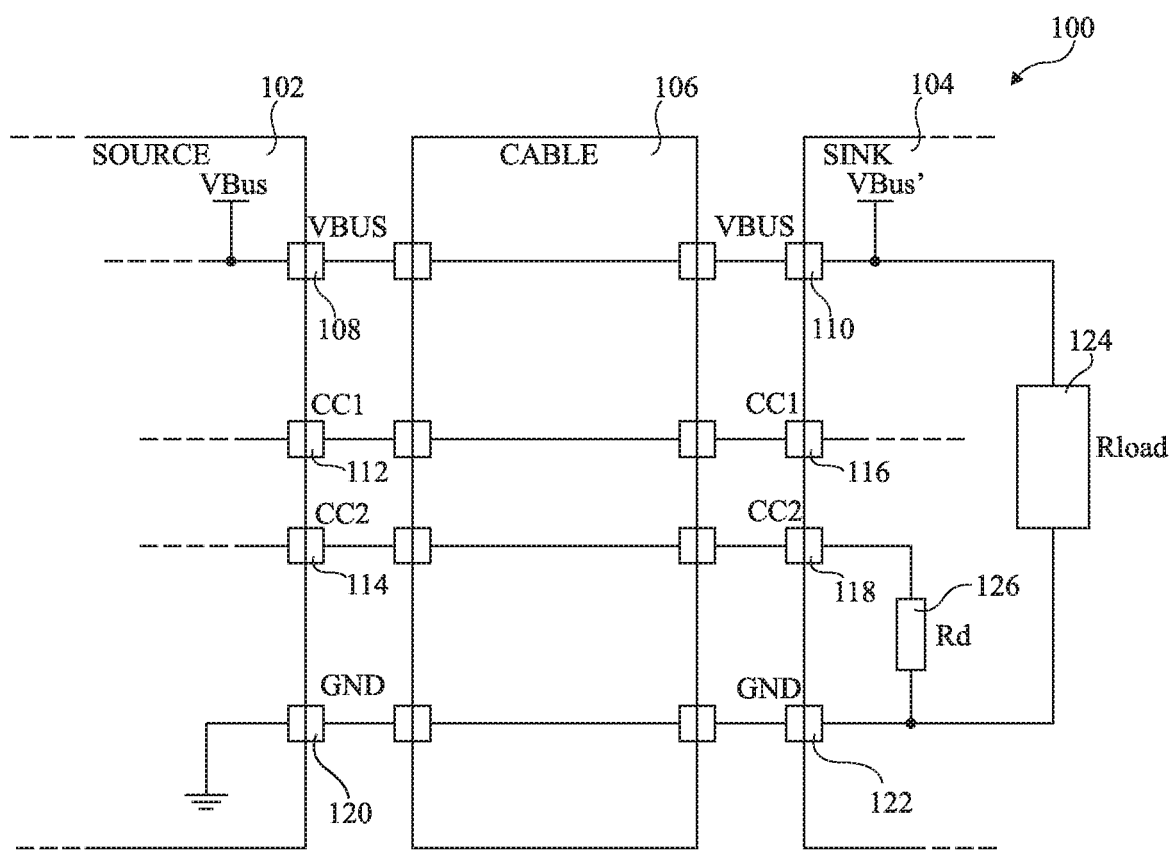
FIG. 1 schematically illustrates a power supply arrangement comprising source and sink devices connected by a cable.

FIG. 1 schematically illustrates a power supply arrangement 100 comprising a source device (SOURCE) 102 coupled to a sink device (SINK) 104 via a cable (CABLE) 106.

In the example of FIG. 1, the devices 102 and 104 are coupled via a USB-C interface having four wires VBUS, CC1, CC2 and GND, although of course the interface can comprise many other wires, for data transmission etc. The wire VBUS is a power bus between the source and sink devices 102, 104. The wires CC1, CC2 are for example configuration channels.

For example, the source device 102 comprises a VBUS output terminal 108 providing a supply voltage VBus. When the cable 106 is attached between the source device 102 and sink device 104, the terminal 108 is electrically coupled via corresponding terminals of the cable 106 to a corresponding VBUS terminal 110 of the sink device 104.

The source device 102 also comprises output terminals 112 and 114 respectively corresponding to the CC1, CC2 wires. The wire CC2 is for example used for detecting the attachment and detachment of the cable 106. When the cable 106 is attached between the source device 102 and sink device 104, the terminal 112 is electrically coupled via corresponding terminals of the cable 106 to a corresponding CC1 terminal 116 of the sink device 104, and the terminal 114 is electrically coupled via corresponding terminals of the cable 106 to a corresponding CC2 terminal 118 of the sink device 104.

The source device 102 further comprises an output terminal 120 providing a ground voltage GND of the source device 102. When the cable 106 is attached between the source device 102 and sink device 104, the terminal 120 is electrically coupled via corresponding terminals of the cable 106 to a corresponding GND terminal 122 of the sink device 104.

The sink device 104 for example couples a load 124 between the VBUS supply terminal 110 and the ground terminal 122, this load having a resistance Rload. For example, this load could correspond to a charger for charging a battery of the sink device 104, or to another type of load.

Furthermore, the sink device 104, for example, comprises a resistor 126 of resistance Rd coupled between the CC2 terminal 118 and the ground terminal 122.

When the supply voltage VBus is supplied from the source device 102 to the sink device 104, the voltage VBus' actually present at the terminal 110 of the sink device 104 may be significantly reduced due the resistance of the cable 106. The USB-C protocol specifies that the voltage drop over the VBUS wire of the cable should not exceed 500 mV. However, when combined with other resistances within the power path of the source device 102, the overall voltage drop can be higher, and can lead to an under-voltage detection at the sink device 104.

Figure 2:
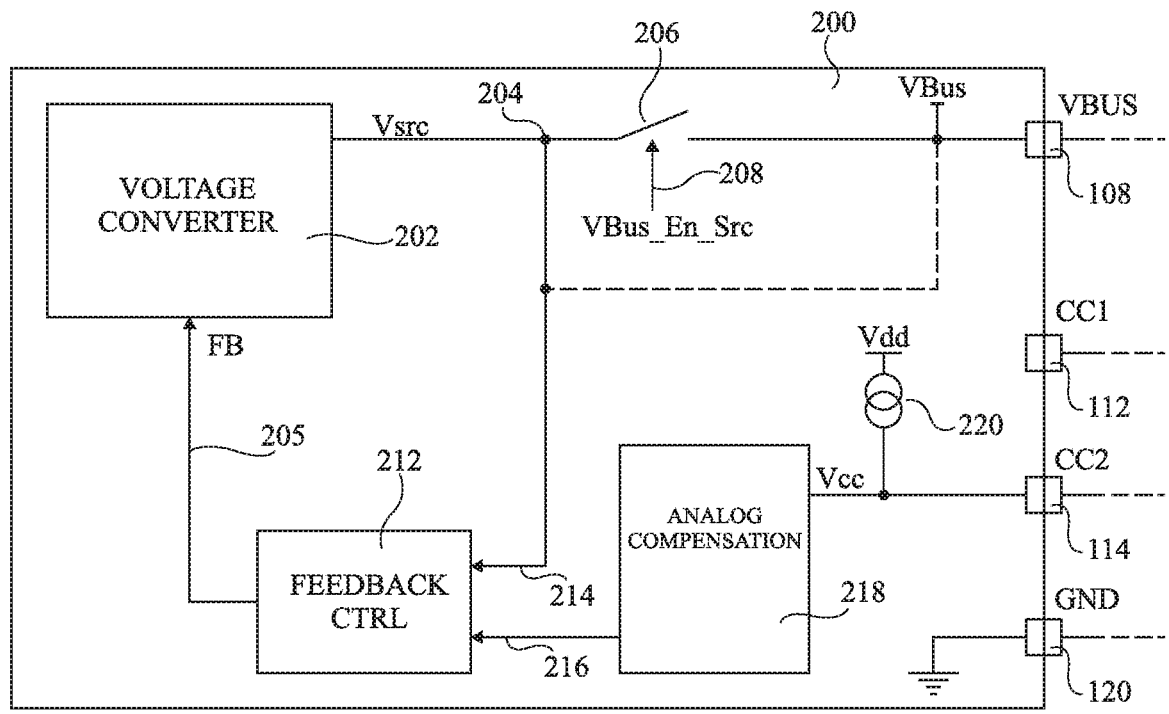
FIG. 2 is a circuit diagram of the voltage source device of FIG. 1 with voltage drop compensation according to an example embodiment of the present disclosure.

FIG. 2 is a circuit diagram of a voltage source device 200 providing cable voltage drop compensation according to an example embodiment of the present disclosure. For example, the device 200 may implement the source device 102 of FIG. 1. The device 200 for example comprises some features in common with the source device 102 of FIG. 1, and these features have been labelled in FIG. 2 with like reference numerals and will not be described again in detail.

The device 200 for example comprises a voltage converter (VOLTAGE CONVERTER) 202 configured to generate a voltage Vsrc at an output node 204 of the voltage converter 202. For example, the voltage converter 202 is a DC to DC converter, or an AC to DC converter. The voltage Vsrc is for example regulated by the voltage converter 202 based on a feedback signal FB on a line 205.

In some embodiments, this feedback signal FB is used to adjust an amount of power transferred by the voltage converter 202, for example by adjusting a duty cycle of the converter 202, and/or by regulating an amount of power transferred by a transformer of the voltage converter 202.

The device 200 for example further comprises a switch 206 coupling the output node 204 of the voltage converter 202 to the VBUS output terminal 108 of the source device 200. The switch 206 is for example controlled by a source enable signal VBus_En_Src provided on a line 208.

The feedback signal FB on the line 205 is for example generated by a feedback control circuit (FEEDBACK CTRL) 212, which for example receives input signals on lines 214 and 216.

The line 214 is, for example, coupled to the output node 204 of the voltage converter 202 and thus receives the voltage Vsrc. In some embodiments, during some modes of operation, the line 214 may alternatively be coupled to the output terminal 108, so that a voltage drop across the switch 206, and across any shunt resistor present in the power path between the output node 204 and the output terminal 108, can be compensated. Such compensation is described in more detail in the patent case in the name of the present applicant, having the same inventors, and filed on the same day as the present application (U.S. Patent Publication Ser. No. 16/906,489, the contents of which is hereby incorporated by reference to the extent permitted by the law.

The line 216 is for example coupled to the output of an analog compensation circuit (ANALOG COMPENSATION) 218 based on a voltage Vcc at the CC2 terminal 114 in order to compensate for the voltage drop over the cable.

For example, the source device 200 comprises a current mirror 220 that supplies a current to the terminal 114 and over the cable to the terminal 118 of the sink device 104.

As illustrated in FIG. 1, in the sink device 104, this current will for example flow to the ground terminals 122 via the resistor 126, and then through the ground wire of the cable 106 to the terminal 120 of the source device. However, the voltage at the terminal 114 will depend not only on the voltage across the resistor 126, but also on the voltage level at the ground terminal 122 of the sink device, which will vary based on the amount of current drawn by the load. Therefore, the voltage Vcc at the terminal 114 provides information regarding the voltage drop over the ground wire between the source and sink devices 102, 104. Therefore, as shown in FIG. 2, this information can be used to compensate for the voltage drop across the VBUS wire, which generally has a fixed resistance ratio with respect to the ground wire. One example of how this compensation can be performed will now be described with reference to FIG. 3.

Figure 3:
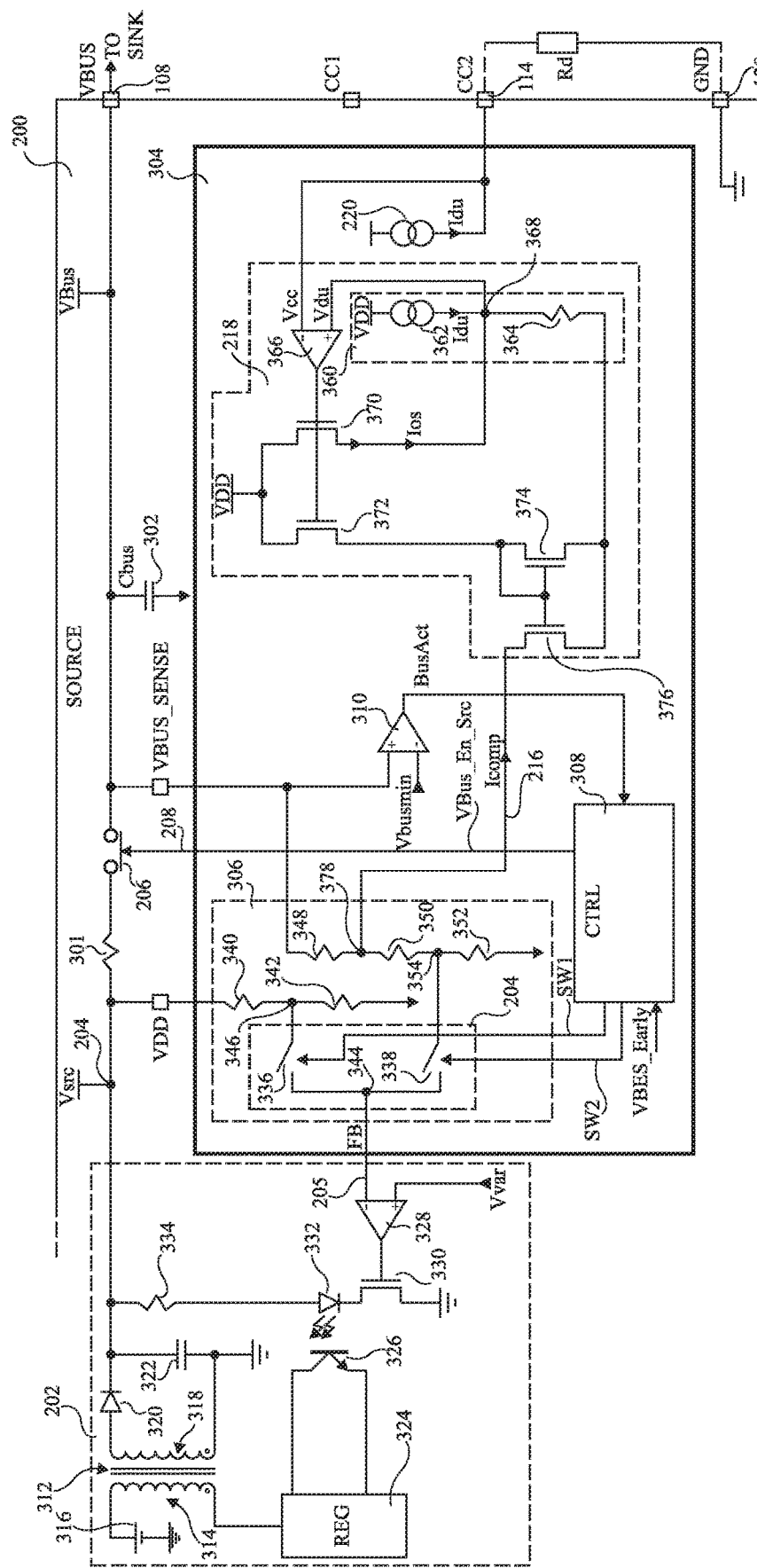
FIG. 3 is a circuit diagram of the voltage source device of FIG. 2 in more detail according to a further example embodiment of the present disclosure.

FIG. 3 is a circuit diagram representing the voltage source device 200 of FIG. 2 in more detail according to an example embodiment. Features in common between the device 200 of FIGS. 2 and 3 have been labelled in FIG. 3 with like reference numerals and will not be described again in detail.

The voltage source device 200 in the example of FIG. 3 includes a shunt resistor 301 coupled between the switch 206 and the output node 204 of the voltage converter 202. This shunt resistor is for example used for current monitoring purposes, the current monitoring circuit not being illustrated in FIG. 3.

Furthermore, in FIG. 3, a decoupling capacitor 302 of capacitance Cbus is for example coupled between the voltage terminal 108 and ground.

As will be explained in more detail below, the source device 200 of FIG. 3 is for example capable of providing compensation of both the voltage drop over the cable and the voltage drop across the switch 206 and shunt resistor 301.

The source device 200 for example comprises the voltage converter 202, a circuit 304 comprising a regulation point selection circuit 306, a control circuit (CTRL) 308, a comparator 310, and the analog compensation circuit 218. The circuits 306, 308 and 310 for example form the feedback control circuit 212 of FIG. 2.

In the example of FIG. 3, the voltage converter 202 is an AC to DC converter. For example, the AC to DC converter 202 comprises a transformer 312 having a primary winding 314 having one end coupled to an AC supply voltage 316, for example at a voltage of 200 to 400 V. The transformer 312 has a secondary winding 318 having one end coupled to the node 204 via a diode 320, and its other end coupled to ground. A capacitor 322 is for example coupled between the node 204 and ground.

The other end of the primary winding 314 is for example coupled to a regulator (REG) 324 that regulates the amount of power transferred by the transformer 312. For example, the regulator 324 includes a phototransistor 326 forming a receiver of an opto-coupler. The phototransistor 326 conducts a current as a function of the intensity of a received optical signal.

The voltage converter 202 for example further comprises a differential amplifier 328 that receives at its negative input the feedback signal FB on the line 205. The positive input of the differential amplifier 328 for example receives a voltage Vvar. The voltage Vvar represents the supply voltage to be provided by the voltage source device 200 at the output terminal 108, this voltage for example being generated by a DAC (Digital to Analog Converter) based on a digital input signal (not illustrated). The output of the differential amplifier 328 is for example coupled to the control node of a transistor 330 having one of its main conducting nodes coupled to ground, and its other main conducting node coupled to the node 204 via the series connection of an LED (Light Emitting Diode) 332 and a resistor 334. The LED 332 forms a transmitter of the opto-coupler, the optical signal from the LED 332 controlling the phototransistor 326.

The regulation point selection circuit 306 for example comprises switches 336 and 338. The circuit 306 for example further comprises a voltage divider formed of resistors 340 and 342 coupled in series between the node 204 and ground. The switch 336 is coupled between a node 344 and an intermediate node 346 between the resistors 340 and 342. The circuit 306 for example also comprises a voltage divider formed of resistors 348, 350 and 352 coupled in series between the output terminal 108 and ground. The switch 338 is for example coupled between the node 344 and an intermediate node 354 between the resistors 350 and 352. The switches 336 and 338 are for example respectively controlled by signals SW1 and SW2 generated by the control circuit 308.

The control circuit 308 also for example generates the source enable signal VBus_En_Src for controlling the switch 206, and for example receives a signal VBES_Early and a bus active signal BusAct from the comparator 310. The signal VBES_Early for example corresponds to an early version of the signal VBus_En_Src, the signal VBus_En_Src for example being delayed by a time delay with respect to the signal VBES_Early. The signal BusAct is for example asserted by the comparator 310 when the voltage VBus at the output terminal 108 is above a threshold Vbusmin.

The current source 220 in the device 200 of FIG. 3 for example applies a current Idu to the output terminal 114.

The analog compensation circuit 218 for example comprises a dummy circuit 360 comprising a dummy current source 362 and a dummy resistor 364 coupled in series between a supply voltage VDD and ground. The current sources 362 and 220 are for example configured to conduct substantially the same current Idu. The resistance Rdu of the dummy resistor 364 is for example equal to around the minimum level of the resistance Rd that is authorized by the USB-C standard, which is for example a resistance of 5.1 k-5%. A differential amplifier 366 is configured to amplify a difference in the voltage Vcc at the output terminal 114 with respect to the voltage Vdu at the intermediate node 368 between the dummy current source 362 and the dummy resistor 364. For example, the differential amplifier 366 has its negative input coupled to the terminal 114, and its positive input coupled to the node 368. The output of the differential amplifier 366 is for example coupled to the control nodes of a pair of transistors 370 and 372, which are for example PMOS transistors.

The transistor 370 is coupled by its main conducting nodes between the supply rail VDD and the intermediate node 368 of the dummy circuit 360. The transistor 370 is for example controlled to conduct an offset current Ios, which is injected into the resistor 364.

The transistor 372 also for example conducts a current under control of the differential amplifier 366, this current being equal to or proportional to the current Ios, and is for example mirrored by a current mirror to generate a compensation current Icomp. The current mirror for example comprises an NMOS transistor 374 coupled by its main conducting nodes between the transistor 372 and ground, and a transistor 376 coupled by its main conducting nodes to an intermediate node 378 between the resistors 348 and 350 of the regulation point selection circuit 306 and ground. The control nodes of the transistors 374, 376 are for example coupled together and to the drain of the transistor 374. Thus, the current Icomp is drawn from the intermediate node 378. For example, the current Icomp is equal to $\alpha \cdot Ios$, where $\alpha$ is a ratio resulting from size ratios between the transistors 370, 372 and/or between the transistors 374, 376.

In operation, when a cable is attached, the differential amplifier 366 regulates the voltage Vdu across the dummy resistor 364 by controlling the offset current Ios. When no load is present on the sink side, the voltage VBus is for example at a no load value VBus0, and the voltage Vdu will equal the voltage Vcc. Thus, no load values Ios0 and Icomp0 of the offset current Ios and compensation current Icomp will be conducted, where:

$$Iso0 = Idu \cdot (Rd/Rdu - 1)$$

and $$Icomp0 = \alpha \cdot Idu \cdot (Rd/Rdu - 1).$$

When a load is applied, a voltage drop will appear over the cable ground wire GND, and thus the voltage Vdu will rise to Vcc+Rgnd·Icable, where Rgnd is the resistance of the ground cable, and Icable is the current flowing through the cable. It follows that the offset current Iso, and compensation current Icomp, will rise as follows:

$$Iso = Iso0 + Rgnd/Rdu \cdot Icable$$

$$Icomp = Icomp0 + \alpha \cdot Rgnd/Rdu \cdot Icable$$

The compensation current Icomp is fed into the regulation loop, for example via the intermediate node 378, and creates an offset such that:

$$VBus = VBus0 + Rcomp \cdot Icomp0 + \alpha \cdot Rcomp \cdot Rgnd/Rdu \cdot Icable$$

where Rcomp is the resistance of the resistor 348.

The ground wire of the cable for example has half the resistance of the VBus wire, and thus in some embodiments the value of a and of the resistances Rcomp and Rdu are chosen such that:

$$\alpha \cdot Rcomp/Rdu = 2$$

Thus:

$$VBus = VBus0 + Rcomp \cdot Icomp0 + 2 \cdot Rgnd \cdot Icable$$

The regulation point switching circuit 306 is for example configured to cause the voltage converter 202 to be regulated in either a first or a second regulation mode. In the first regulation mode, the voltage conversion is regulated based on the voltage Vsrc, in which case the switch 336, and not the switch 338, is for example activated by the signal SW1. In the second regulation mode, the voltage conversion is for example regulated based on the voltage VBus, in which case the switch 338, and not the switch 336, is for example activated. During the second regulation mode, the voltage Vsrc is also for example regulated based on the signal Icomp, in order to compensate for the cable voltage drop.

In operation, initially, when the cable is not attached, the signal VBus_En_Src is not asserted, and the control circuit 308 for example controls the switches 336, 338 to operate in the first regulation mode. In some embodiments, the voltage Vsrc is regulated at a default safe voltage of 5 V in this state.

When the source enable signal VBus_En_Src is asserted, the power path is for example closed by the activation of the signal VBus_En_Src, but the sink is not yet drawing a current. The voltage conversion provided by the converter 202 continues to be regulated, in the first regulation mode, based on the voltage Vsrc at the node 204. In some embodiments, the voltage conversion continues to be regulated based on the voltage Vsrc for a minimum time duration tcheck after the activation of the signal VBus_En_Src, thereby allowing the decoupling capacitor 302 to be charged. In some embodiments, the duration tcheck is of between 50 and 200 μs, and for example around 100 μs.

The comparator 310 then detects when the voltage VBus has risen above the threshold level Vbusmin. This threshold level Vbusmin is for example equal to between 3 and 4.8 V, and for example around 4 V. Alternatively, this threshold level Vbusmin is between 5% and 40% lower than the negotiated voltage level to be provided by the source device.

For example, the threshold level Vbusmin is selected to have the following levels based on the PDO (Power Data Object) supply voltage:

TABLE 1

| PDO | 5.1 V | 9 V | 12 V | 15 V | 20 V |
|---|---|---|---|---|---|
| Vbusmin | 3.595 V | 7.3 V | 10.15 V | 13 V | 17.75 V |

While VBus is below Vbusmin, the voltage conversion for example continues to be regulated, in the first regulation mode, based on the voltage Vsrc. This for example prevents, in the case of a defect in the power path, the voltage converter from entering into an open loop, which could damage the entire system.

Once the voltage VBus has risen above Vbusmin as indicated by the signal BusAct, the regulation of the voltage conversion is switched to a second regulation mode in which it is based on the voltage VBus.

The signal VBES_Early is then asserted, for example if a cable detachment is detected or the source power supply is otherwise to be interrupted. Such a detection is known in the art, and is for example based on a voltage measured at the CC1 terminal of the USB-C socket. When the signal VBES_Early is asserted, indicating the imminent deactivation of the source enable signal VBus_En_Src, the control circuit 308 for example switches back to the first regulation mode.

While FIG. 3 illustrates an embodiment providing regulation point selection using the circuit 306, in alternative embodiments, regulation could also be performed based on the voltage Vsrc at the node 204. In such a case, the switch 336, and voltage divider formed by the resistors 340 and 342 could be omitted, and the voltage divider formed by the resistors 348, 350 and 352 could be coupled between the node 204 and ground rather than between the terminal 108 and ground.

Figure 4:
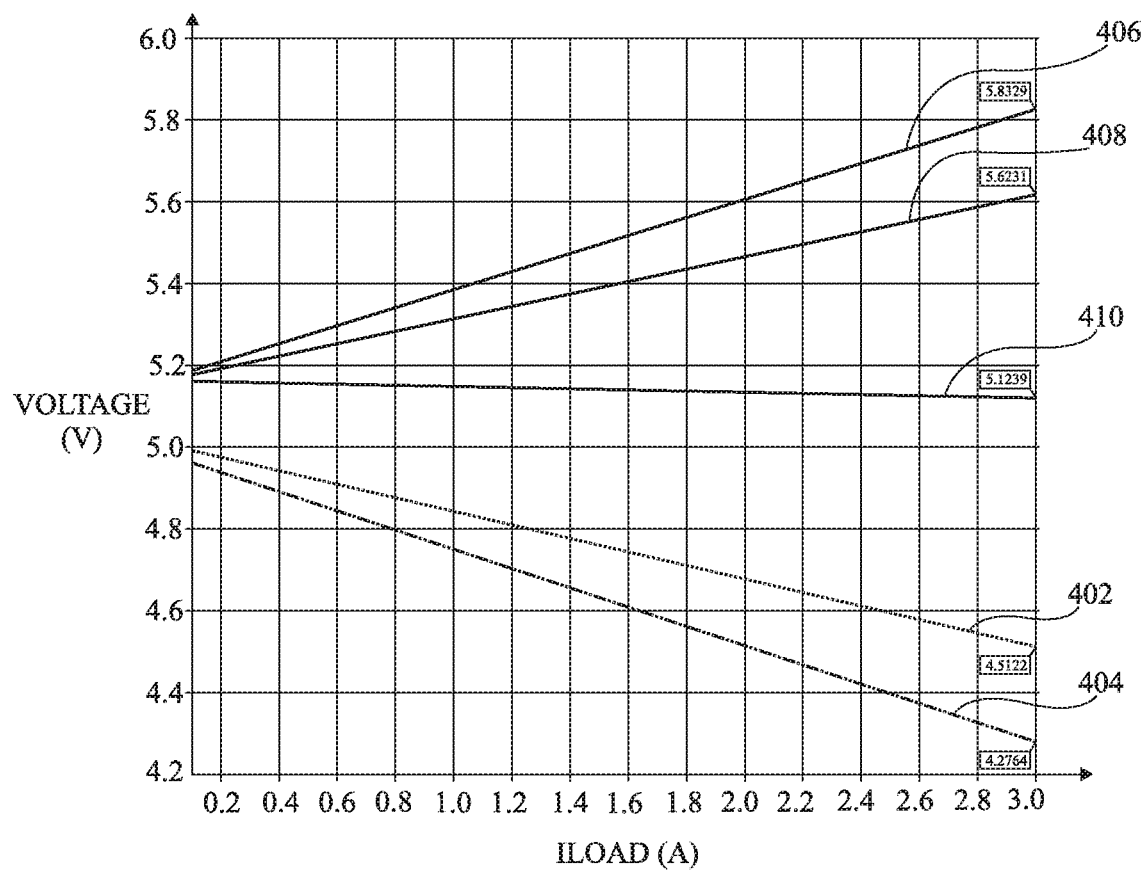
FIG. 4 is a graph representing an example of voltages in the voltage source device of FIG. 3 and in an attached sink device.

FIG. 4 is a graph of simulated voltages in the voltage source device 600 of FIG. 3 and corresponding sink device as a function of the load current.

A curve 402 represents the voltage VBus at the source side in the case that there is no voltage drop compensation, and assuming a voltage Vsrc of 5 V. It can be seen that, for a current of 1 A, the voltage VBus at the source side falls to around 4.85 V, and for a current of 3 A, the voltage VBus at the source side falls to around 4.5 V.

A curve 404 represents the voltage VBus at the sink side in the case that there is no voltage drop compensation, and assuming a voltage Vsrc of 5 V. It can be seen that, with the added voltage drop across the cable, for a current of 1 A, the voltage VBus at the sink side falls to around 4.75 V, and for a current of 3 A, the voltage VBus at the sink side falls to around 4.25 V. Such a voltage could be detected as an under-voltage by the sink device.

A curve 406 represents the voltage Vsrc after voltage drop compensation of both the voltage drop across the switch and the voltage drop in the cable 106. For a current of 1 A, the Vsrc voltage is now at around 5.4 V, and for a current of 3 A, the Vsrc voltage is now at around 5.85 V.

A curve 408 represents the voltage VBus on the source side with the Vsrc voltage of the curve 406. For a current of 1 A, the voltage VBus is now at around 5.3 V, and for a current of 3 A, the voltage VBus is now at around 5.6 V.

A curve 410 represents the voltage VBus on the sink side with the Vsrc voltage of the curve 406. For a current of 1 A, the voltage VBus at the sink side is now at around 5.15 V, and for a current of 3 A, the voltage VBus at the sink side is now at around 5.1 V. These levels are sufficiently high not to be considered as under-voltages at the sink side, and are even slightly higher than the target level of 5 V.

An advantage of the embodiments described herein is that a voltage drop across a cable between source and sink devices can be compensated in a relative simple manner.

Various embodiments and variants have been described. Those skilled in the art will understand that certain features of these embodiments can be combined and other variants will readily occur to those skilled in the art. For example, it will be apparent to those skilled in the art that the ground voltage described herein could be replaced by any positive or negative reference voltage that is for example lower than the supply voltages Vsrc and VBus.

Furthermore, the various transistors of the various circuits could be implemented by CMOS transistor technologies, or by other transistor technologies, and n-channel transistors could be replaced by p-channel transistors, and vice versa, in alternative implementations.

Finally, the practical implementation of the embodiments and variants described herein is within the capabilities of those skilled in the art based on the functional description provided hereinabove. For example, the implementation of various types of DC to DC and AC to DC voltage converter is known to those skilled in the art and has not been described in detail.

What is claimed is:

1. A circuit comprising:
a voltage converter configured to generate a supply voltage at an output node of the voltage converter;
a current source configured to apply a current to a first output terminal of the circuit in order to detect a cable voltage drop; and
a compensation circuit configured to generate a feedback signal based on a voltage at the first output terminal, the supply voltage being generated based on the feedback signal, the compensation circuit comprising:
an analog compensation circuit configured to generate an analog compensation signal,
a feedback control circuit configured to adjust the feedback signal based on the analog compensation signal, and
a voltage divider comprising a series connection of first, second, and third resistors coupling the output node of the voltage converter to a first supply rail, wherein the analog compensation signal is a current drawn from a first intermediate node between the first and second resistors and the feedback signal is provided by a second intermediate node between the second and third resistors.

2. The circuit of claim 1, wherein the analog compensation circuit comprises a differential amplifier configured to amplify a difference between the voltage at the first output terminal and a reference voltage.

3. The circuit of claim 2, further comprising a dummy circuit configured to generate the reference voltage, the dummy circuit comprising a further current source coupled in series with fourth resistor, wherein the reference voltage is the voltage across the fourth resistor.

4. The circuit of claim 3, wherein the differential amplifier is configured to control a first transistor to conduct an offset current that is passed through the fourth resistor.

5. The circuit of claim 4, wherein the differential amplifier is also configured to control a second transistor, the analog compensation signal being based on a current conducted by the second transistor.

6. A system comprising:

a voltage source device comprising a voltage converter configured to generate a supply voltage at an output node of the voltage converter, a current source configured to apply a current to a first output terminal of the voltage source device in order to detect a cable voltage drop; and
a compensation circuit configured to generate a feedback signal based on a voltage at the first output terminal, the supply voltage being generated based on the feedback signal;
a sink device; and
a universal serial bus (USB) cable coupling the first output terminal of the voltage source device to a first terminal of the sink device, a second output terminal of the voltage source device to a second terminal of the sink device, and a ground terminal of the voltage source device to a ground terminal of the sink device.

7. The system of claim 6, wherein the sink device comprises a resistor coupled between the first terminal and the ground terminal of the sink device.

8. The system of claim 7, wherein the sink device further comprises a load coupled between the second terminal and the ground terminal of the sink device.

9. The system of claim 6, wherein the sink device comprises a load coupled between the second terminal and the ground terminal of the sink device.

10. A circuit comprising:
a supply voltage terminal configured to be coupled to a first line of a cable;
a reference voltage terminal configured to be coupled to a second line of the cable;
a control channel terminal configured to be coupled to a third line of the cable;
a voltage converter having a first terminal coupled to the supply voltage terminal;
a feedback control circuit having an output coupled to the voltage converter, a first input coupled to the first terminal of the voltage converter and a second input;
an analog compensation circuit comprising a first terminal coupled to the control channel terminal and a second terminal coupled to the second input of the feedback control circuit;
a current source coupled to the first terminal of the analog compensation circuit; and
a voltage divider comprising a series connection of first, second and third resistors coupled between the supply voltage terminal and a reference terminal, wherein the second terminal of the analog compensation circuit is coupled to a first intermediate node between the first and second resistors and the output of the feedback control circuit is coupled to a second intermediate node between the second and third resistors.

11. The circuit of claim 10, further comprising a switch coupled between the first terminal of the voltage converter and the supply voltage terminal.

12. The circuit of claim 10, wherein the analog compensation circuit comprises a differential amplifier having a first input coupled the control channel terminal and a second input coupled to a reference voltage node.

13. The circuit of claim 12, further comprising a dummy circuit with an output coupled to the reference voltage node, the dummy circuit comprising a further current source coupled in series with a resistor.

14. A method of compensating for a voltage drop over a universal serial bus (USB) cable that couples a voltage source device to a sink device, the method comprising:

applying a current to a first output terminal of the voltage source device in order to detect a voltage drop along the USB cable;

generating a feedback signal based on a voltage at the first output terminal;

generating a supply voltage at an output node of a voltage converter based on the feedback signal; and applying the supply voltage to a supply voltage line of the USB cable.

15. The method of claim 14, further comprising generating an analog compensation signal and adjusting the feedback signal based on the analog compensation signal.

16. The method of claim 15, wherein generating the analog compensation signal comprises amplifying a difference between a voltage at the first output terminal and a reference voltage.

17. A circuit comprising:
a voltage converter configured to generate a supply voltage at an output node of the voltage converter;
a current source configured to apply a current to a first output terminal of the circuit in order to detect a cable voltage drop; and
a compensation circuit configured to generate a feedback signal based on a voltage at the first output terminal, the supply voltage being generated based on the feedback signal, the compensation circuit comprising:
an analog compensation circuit configured to generate an analog compensation signal,
a feedback control circuit configured to adjust the feedback signal based on the analog compensation signal, and
a voltage divider comprising a series connection of first, second, and third resistors coupling a second output terminal of the circuit, to a first supply rail, wherein the analog compensation signal is a current drawn from a first intermediate node between the first and second resistors and the feedback signal is provided by a second intermediate node between the second and third resistors.

18. The circuit of claim 17, wherein the analog compensation circuit comprises a differential amplifier configured to amplify a difference between the voltage at the first output terminal and a reference voltage.

19. The circuit of claim 18, further comprising a dummy circuit configured to generate the reference voltage, the dummy circuit comprising a further current source coupled in series with a fourth resistor, wherein the reference voltage is the voltage across the fourth resistor.

20. The circuit of claim 19, wherein the differential amplifier is configured to control a first transistor to conduct an offset current that is passed through the fourth resistor.

21. The circuit of claim 20, wherein the differential amplifier is also configured to control a second transistor, the analog compensation signal being based on a current conducted by the second transistor.

* * * * *